(12) United States Patent  
Chen et al.

(10) Patent No.: US 9,871,518 B2
(45) Date of Patent: Jan. 16, 2018

(54) MEMORY INTERFACE CIRCUIT CAPABLE OF CONTROLLING DRIVING ABILITY AND ASSOCIATED CONTROL METHOD

(71) Applicant: MEDIATEK INC., Hsin-Chu (TW)

(72) Inventors: Shang-Pin Chen, Hsinchu County (TW); Chia-Yu Chan, Kaohsiung (TW); Bo-Wei Hsieh, Tainan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/247,903

(22) Filed: Aug. 25, 2016

(65) Prior Publication Data

US 2017/0222647 A1  Aug. 3, 2017

Related U.S. Application Data

(60) Provisional application No. 62/289,931, filed on Feb. 2, 2016.

(51) Int. Cl.
| | |
|---|---|
| *H03K 19/00* | (2006.01) |
| *G11C 5/00* | (2006.01) |
| *G11C 7/10* | (2006.01) |
| *G11C 11/4074* | (2006.01) |
| *G06F 3/06* | (2006.01) |
| *H03K 19/0175* | (2006.01) |
| *H03K 19/018* | (2006.01) |
| *H03K 19/0185* | (2006.01) |
| *G11C 5/04* | (2006.01) |

(52) U.S. Cl.
CPC ....... *H03K 19/0005* (2013.01); *G06F 3/0625* (2013.01); *G06F 3/0659* (2013.01); *G06F 3/0683* (2013.01); *G11C 5/04* (2013.01); *G11C 7/1057* (2013.01); *G11C 7/1084* (2013.01); *G11C 11/4074* (2013.01); *H03K 19/01825* (2013.01); *H03K 19/017545* (2013.01); *H03K 19/018557* (2013.01)

(58) Field of Classification Search
CPC .. G06F 13/4086; G06F 3/0683; G06F 3/0659; G06F 3/0625; H03K 19/0005; H03K 19/017545; H03K 19/01825; H03K 19/018557; H05K 1/0246; G11C 11/4074
See application file for complete search history.

(56) References Cited

U.S. PATENT DOCUMENTS

| | | | | |
|---|---|---|---|---|
| 6,084,434 A | | 7/2000 | Keeth | |
| 7,196,540 B2 * | | 3/2007 | Ueno | H03K 19/0005 326/26 |
| 7,439,760 B2 * | | 10/2008 | Nguyen | H04L 25/0278 326/30 |
| 7,696,775 B2 * | | 4/2010 | Jian | G11C 7/1051 326/30 |
| 7,710,169 B2 * | | 5/2010 | Tanaka | H03K 17/164 326/82 |
| 9,401,721 B1 * | | 7/2016 | Barakat | G11C 7/1084 |

(Continued)

*Primary Examiner* — Vibol Tan
(74) *Attorney, Agent, or Firm* — Winston Hsu

(57) ABSTRACT

A memory interface circuit includes a first variable impedance circuit coupled between a first supply voltage and a pad, and a second variable impedance circuit coupled between a second supply voltage and the pad; wherein when the first supply voltage changes, at least one of the first variable impedance circuit and the second variable impedance circuit is controlled to have different setting in response to the changing of the first supply voltage.

31 Claims, 9 Drawing Sheets

(56) References Cited

U.S. PATENT DOCUMENTS

| | | | |
|---|---|---|---|
| 2008/0094112 A1* | 4/2008 | Tanaka | H03K 19/0005 |
| | | | 327/108 |
| 2008/0112246 A1 | 5/2008 | Mei | |
| 2008/0122478 A1 | 5/2008 | Mei | |
| 2009/0102511 A1* | 4/2009 | Hirose | H03K 19/00384 |
| | | | 326/30 |
| 2009/0160480 A1* | 6/2009 | Kikkawa | H03K 19/00346 |
| | | | 326/30 |
| 2014/0126665 A1* | 5/2014 | Lee | H04B 1/1607 |
| | | | 375/295 |
| 2015/0115999 A1* | 4/2015 | Lee | H03K 19/01754 |
| | | | 326/30 |
| 2015/0170719 A1* | 6/2015 | Chen | G11C 7/109 |
| | | | 711/170 |

* cited by examiner

MEMORY INTERFACE CIRCUIT CAPABLE OF CONTROLLING DRIVING ABILITY AND ASSOCIATED CONTROL METHOD

CROSS REFERENCE TO RELATED APPLICATIONS

This application claims the priority of U.S. Provisional Application No. 62/289,931, filed on Feb. 2, 2016, which is included herein by reference in its entirety.

BACKGROUND

Recently, in order to lower a power consumption of a chip, a supply voltage of the chip is controlled to have different levels according to a loading of the chip. When the supply voltage changes, however, transmitters within the chip may suffer some driving ability issues. Therefore, how to control the interface circuit to avoid the driving ability issues is an important topic.

SUMMARY

It is therefore an objective of the present invention to provide a memory interface circuit and associated method, which may control the driving ability according to the changing of the supply voltage, to solve the above-mentioned problem.

According to one embodiment of the present invention, a memory interface circuit includes a first variable impedance circuit coupled between a first supply voltage and a pad, and a second variable impedance circuit coupled between a second supply voltage and the pad; wherein when the first supply voltage changes, at least one of the first variable impedance circuit and the second variable impedance circuit is controlled to have different setting in response to the changing of the first supply voltage.

According to another embodiment of the present invention, a memory interface circuit comprises a programmable reference voltage generator and a comparator. The programmable reference voltage generator is arranged for generating a reference voltage according to a control signal generated according to a level of a supply voltage of the memory interface circuit; and the comparator is arranged for comparing a received signal from a pad with the reference voltage to generate a comparison signal.

According to another embodiment of the present invention, a control method of a memory interface circuit is disclosed, wherein the memory interface comprises a first variable impedance circuit coupled between a first supply voltage and a pad, and a second variable impedance circuit coupled between a second supply voltage and the pad, and the control method comprises: when the first supply voltage changes, applying different setting to at least one of the first variable impedance circuit and the second variable impedance circuit in response to the changing of the first supply voltage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
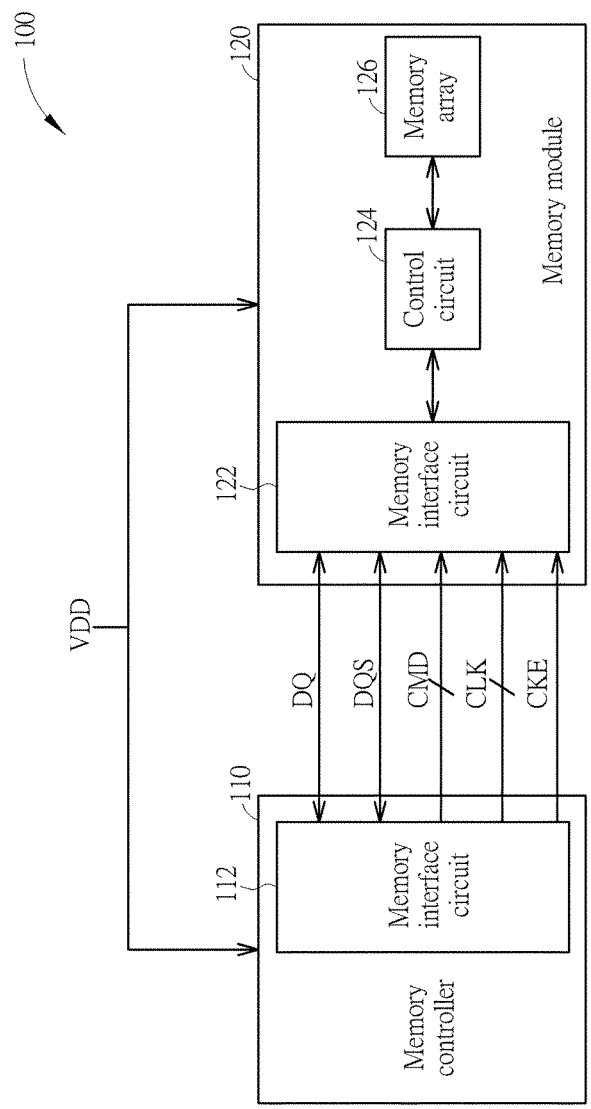
FIG. 1 is a diagram illustrating a memory system according to one embodiment of the present invention.

Please refer to FIG. 1, which is a diagram illustrating a memory system 100 according to one embodiment of the present invention. As shown in FIG. 1, the memory system 100 comprises a memory controller 110 and a memory module 120 supplied by a supply voltage VDD, where the memory controller 110 comprises a memory interface circuit 112, and the memory module 120 comprises a memory interface circuit 122, a control circuit 124 and a memory array 126. In this embodiment, the memory controller 110 and the memory module 120 are connected via a plurality of connection lines, where the connection lines are used to transmit at least a bi-directional data signal DQ, a bi-directional data strobe signal DQS, a plurality of command signals CMDs, a differential clock signal CLK and a clock enable signal CKE. In addition, in this embodiment, the memory system 100 is a volatile memory system such as a DRAM system, that is the memory controller 110 is the DRAM memory controller, and the memory module 120 is a DRAM memory module.

When the memory system 100 is implemented by the DRAM system the command signals may comprise at least a row address strobe, a column address strobe, and a write enable signal. In addition, the clock signal or the command signals shown in FIG. 1 can be single-directional or bi-directional.

In the operations of the memory system 100, the memory controller 110 is arranged to receive a request from a host or a processor, and to transmit at least a portion of the data signal DQ, data strobe signal DQS, command signals CMDs, the clock signal CLK and the clock enable signal CKE to access the memory module 120. In addition, the memory controller 110 may further comprise associated circuits, such as an address decoder, a processing circuit, a write/read buffer, a control logic and an arbiter, to perform the related operations. The memory interface circuit 112 of the memory controller 112 is arranged to output the data signal DQ, data strobe signal DQS, command signals CMDs, the clock signal CLK and the clock enable signal CKE to the memory module 120. The memory interface circuit 122 is arranged to receive the data signal DQ, data strobe signal DQS, command signals CMDs and the clock signal CLK from the memory controller 110, and to output the data to the memory controller via the DQ connection lines. The control circuit 124 may comprise a read/write controller, a row decoder and a column decoder, and the control circuit 124 is arranged to receive output signals from the memory interface circuit 122 to access the memory array 126.

Figure 2:
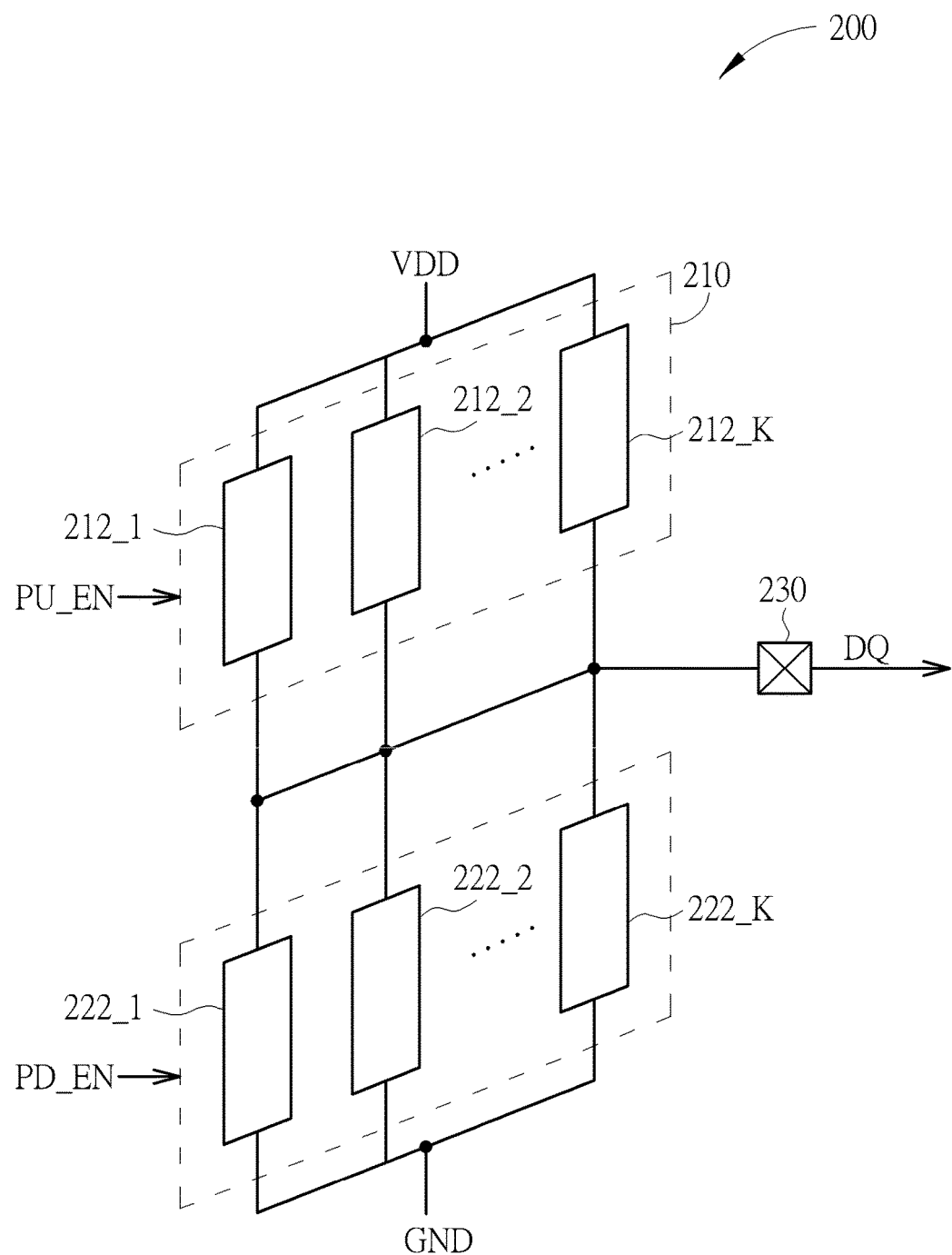
FIG. 2 is a diagram illustrating a driver within the memory interface circuit according to one embodiment of the present invention.

Please refer to FIG. 2, which is a diagram illustrating a driver 200 within the memory interface circuit 112/122 according to one embodiment of the present invention. As shown in FIG. 2, the driver 200 comprises a first variable impedance circuit 210 and a second variable impedance circuit 220, where the first variable impedance circuit 210 is coupled between the supply voltage VDD and a pad 230, and the first variable impedance circuit 210 comprises a plurality of impedance elements 212_1-212_K connected in parallel; and the second variable impedance circuit 220 is coupled between a ground voltage GND and the pad 230, and the second variable impedance circuit 220 comprises a plurality of impedance elements 222_1-222_K connected in parallel. In this embodiment, the impedance elements 212_1-212_K and 222_1-222_K can be implemented by PMOS, NMOS or MOS with resistor. Taking FIG. 3 as an example, in FIG. 3(a), one or more of the impedance element 212_1-212_K is implemented by an NMOS, while one or more of the impedance element 222_1-222_K is also implemented by an NMOS; in FIG. 3(b), one or more of the impedance element 212_1-212_K is implemented by a PMOS, while one or more of the impedance element 222_1-222_K is implemented by an NMOS; and in FIG. 3(c), one or more of the impedance element 212_1-212_K is implemented by an NMOS with a resistor, while one or more of the impedance element 222_1-222_K is implemented by an NMOS.

In this embodiment, the driver 200 is positioned in the memory interface circuit 112 to output the data signal DQ to the memory module 120, but it's not a limitation of the present invention. In other embodiments, the driver 200 may be applied to any driver within the memory interface circuit 112 to output the signal to the memory module 120, or the driver 200 may be applied to any driver within the memory interface circuit 122 to output the signal to the memory controller 110. For example, the memory interface circuit 112 may comprise a plurality of drivers 200 to output the data signal DQ, the data strobe signal DQS, the command signals CMDs, the clock signal CLK and the clock enable signal CKE to the memory module 120; and the memory interface circuit 122 may comprise a plurality of drivers 200 to output the data signal DQ and the data strobe signal DQS to the memory controller 110.

Figure 3:
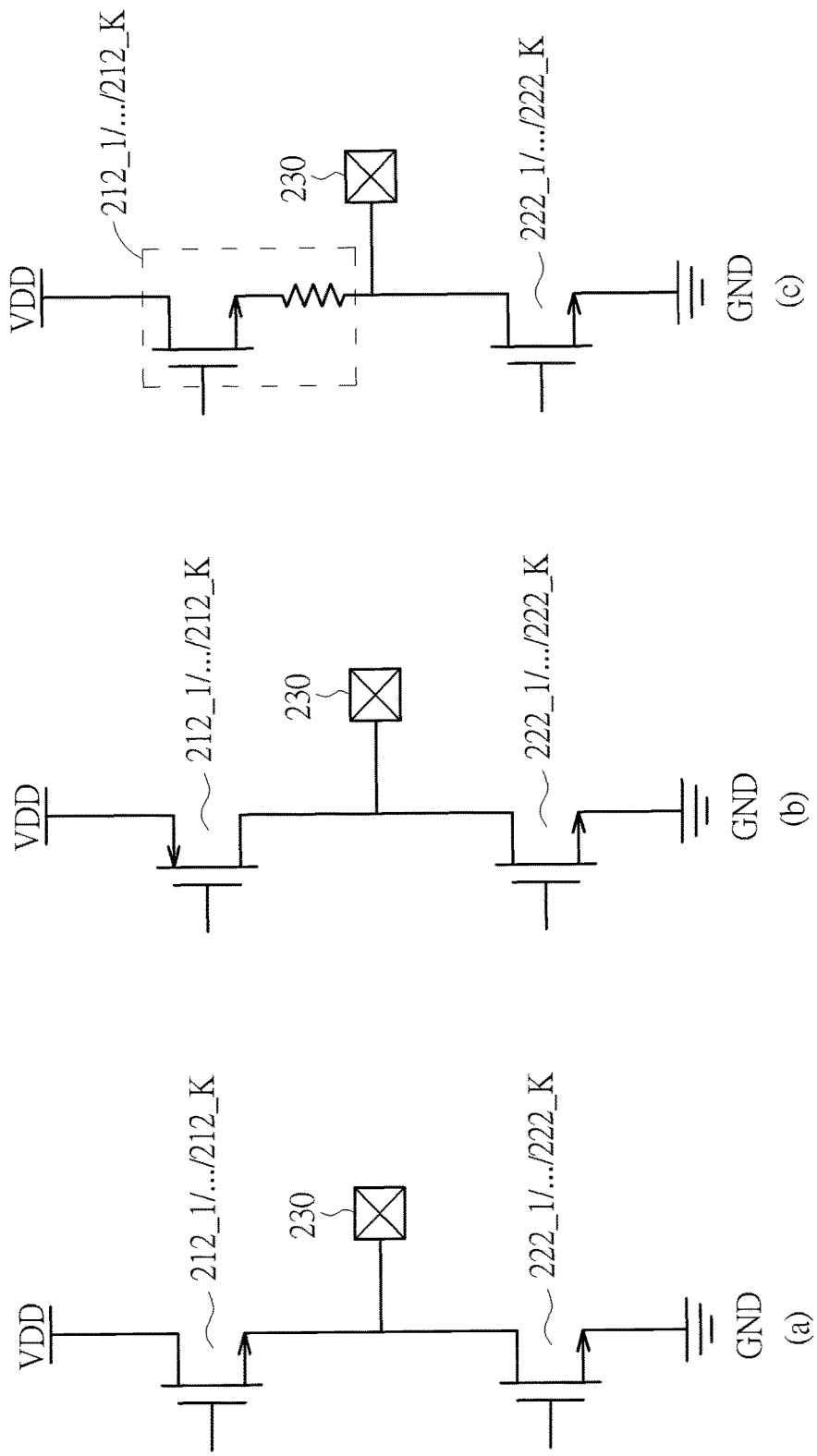
FIG. 3 shows several embodiments of the impedance elements.

In the embodiment shown in FIG. 2, the first variable impedance circuit 210 receives a first driving control signal (digital signal) PU_EN to adjust its impedance. For example, the first driving control signal PU_EN represents that how many impedance elements 212_1-212_K are turned on (i.e. how many PMOS/NMOS 212_1-212_K shown in FIG. 3 are turned on), and the impedance of the first variable impedance circuit 210 is determined based on a quantity of turned-on impedance elements 212_1-212_K, and the more turned-on impedance elements 212_1-212_K, the lower impedance of the first variable impedance circuit 210. Similarly, the second variable impedance circuit 220 receives a second driving control signal (digital signal) PD_EN to adjust its impedance. For example, the second driving control signal PD_EN represents that how many impedance elements 222_1-222_K are turned on (i.e. how many NMOS 222_1-222_K shown in FIG. 3 are turned on), and the impedance of the second variable impedance circuit 220 is determined based on a quantity of turned-on impedance elements 222_1-222_K, and the more turned-on impedance elements 222_1-222_K, the lower impedance of the second variable impedance circuit 220.

Figure 4:
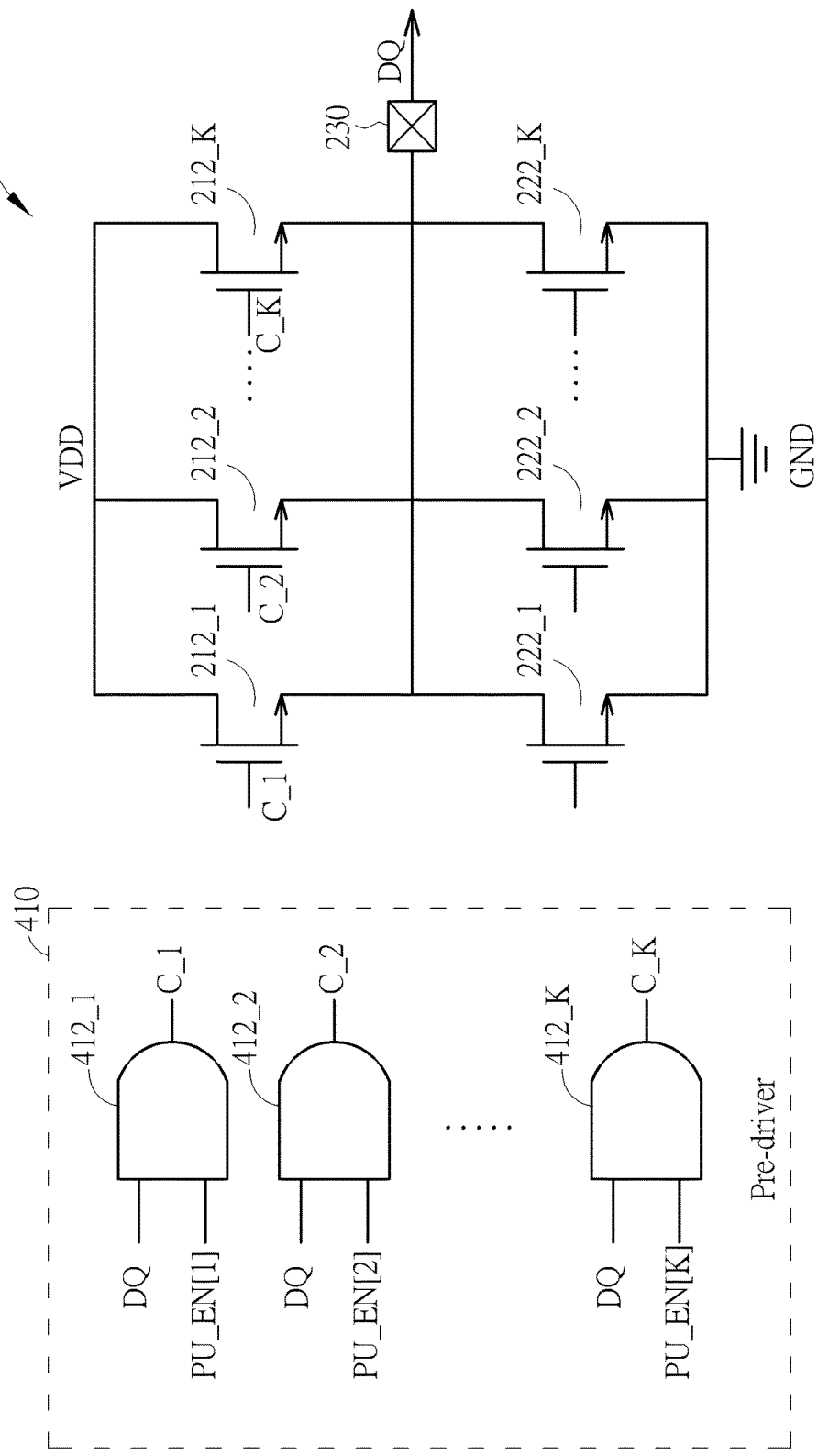
FIG. 4 is a diagram illustrating a pre-driver and the driver according to one embodiment of the present invention.

In practice, the memory interface circuit 112/122 may further have a pre-driver, and the first driving control signal PU_EN and the second driving control signal PD_EN control the impedance of the first variable impedance circuit 210 and the second variable impedance circuit 220 via the pre-driver. Please refer to FIG. 4, which is a diagram illustrating a pre-driver 410 and the driver 200 according to one embodiment of the present invention. As shown in FIG. 4, the pre-driver 410 comprises a plurality of AND gates 412_1-412_K, and the AND gates 412_1-412_K receive the data signal DQ and the first driving control signal PU_EN[1]-PU_EN[K] to generate signals C_1-C_K, respectively. In the embodiment shown in FIG. 4, the pre-driver 410 selectively outputs the data signal DQ to the impedance elements 212_1-212_K according to the first driving control signal PU_EN[1]-PU_EN[K], and the first driving control signal PU_EN[1]-PU_EN[K] represents that how many impedance elements 212_1-212_K are allowed to receive the data signal DQ. In detail, if PU_EN[1]-PU_EN[3]="1", the signals C_1-C_3 are the same as the data signal DQ, and the output signal at the pad 230 is also substantially equal to the data signal DQ.

Figure 5:
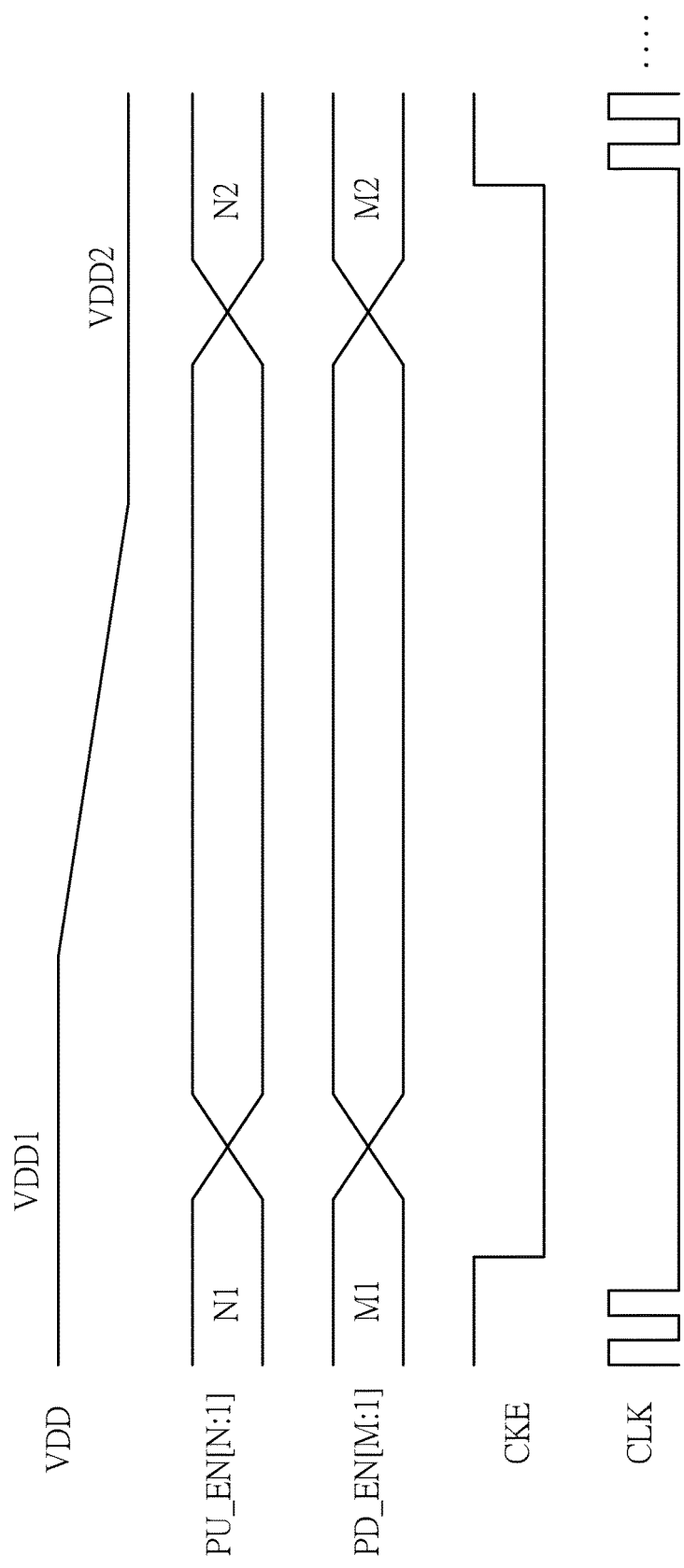
FIG. 5 is a diagram illustrating a timing diagram of the driving control signals and related signals when the supply voltage changes according to one embodiment of the present invention.

Please refer to FIG. 5, which is a diagram illustrating a timing diagram of the related signals when the supply voltage VDD changes according to one embodiment of the present invention. As shown in FIG. 5, originally, the supply voltage VDD has a first value VDD1, the first driving control signal PU_EN has a setting [N1:1] to determine a quantity of turned-on impedance elements 212_1-212_K, the second driving control signal PD_EN has a setting [M1:1] to determine a quantity of turned-on impedance elements 222_1-222_K, the clock enable signal CKE is at a high level, the clock signal CLK is outputted to the memory module 120, and the memory controller 110 functions well to access the memory module 120. Then, when a power manage integrated circuit (PMIC) wants to change the supply voltage VDD of the memory controller 110 and the memory module 120 to save power, the memory controller 110 will disable the clock enable signal CKE (i.e. at a low level) and stop outputting the clock signal CLK to the memory module 120, then the PMIC changes the supply voltage VDD to have a second value VDD2. After the supply voltage VDD changes, the memory controller 110 may send the first driving control signal PU_EN having another setting [N2:1] to determine another quantity of turned-on impedance elements 212_1-212_K, and the memory controller 110 may also send the second driving control signal PD_EN having another setting [M2:1] to determine another quantity of turned-on impedance elements 222_1-222_K. Finally, the memory controller 110 enables the clock enable signal CKE and outputs the clock signal CLK to access the memory module 120.

In the embodiment shown in FIG. 5, when the supply voltage VDD decreases from VDD1 to VDD2, the impedance of the first variable impedance circuit 210 maybe increased due to a decreased drain-source voltage (Vds), and the driving ability of the driver 200 may be lowered. Therefore, the first driving control signal PU_EN may have different setting to increase the quantity of the impedance elements 212_1-212_K to compensate the driving ability. For example, assuming that each of the impedance elements 212_1-212_K is 100 ohm, the first driving control signal PU_EN has the setting [N1:1] to turn on five of the impedance elements 212_1-212_K (e.g. 212_1-212_5 are turned on, and others are turns off) when the supply voltage VDD is 1V (i.e. VDD1=1V), that is the equivalent impedance of the first variable impedance circuit 210 is 20 ohm. Then, when the supply voltage VDD changes to 0.5V (i.e. VDD2=0.5V), each of the impedance elements 212_1-212_K may be increase to be 200 ohm, the first driving control signal PU_EN may have the setting [N2:1] to turn on ten of the impedance elements 212_1-212_K (e.g. 212_1-212_10 are turned on, and others are turns off), to make the first variable impedance circuit 210 have the same equivalent impedance 20 ohm.

By using the aforementioned embodiments, the driving ability of the interface circuit 112/122 will not be influenced due to the changing of the supply voltage VDD, and the access quality will be more stable.

Figure 6:
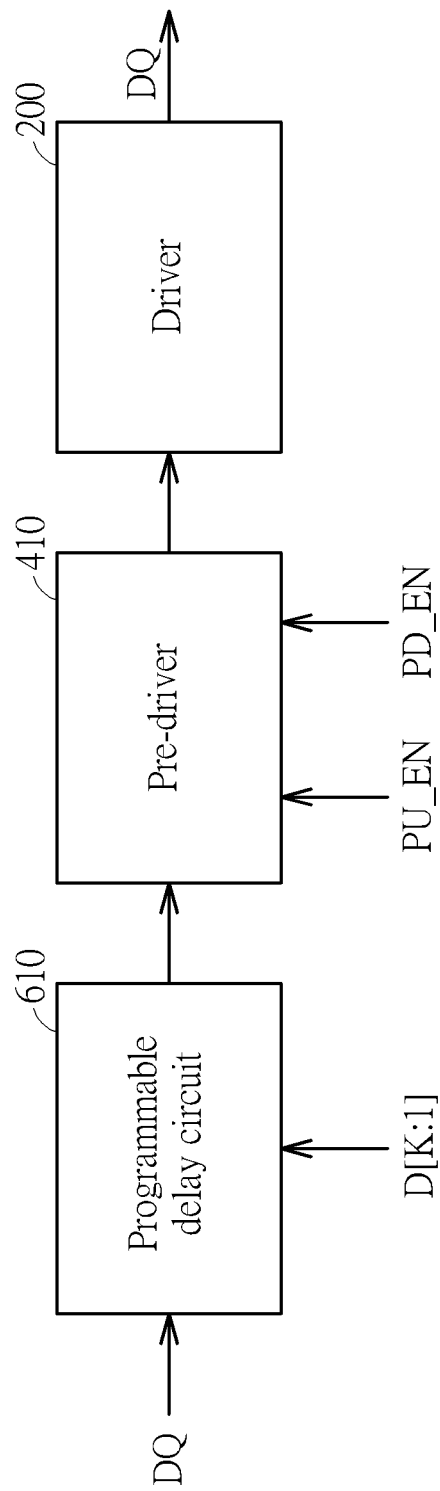
FIG. 6 is a diagram illustrating a programmable delay circuit according to one embodiment of the present invention.

In one embodiment, when the driver 200 is position in the memory interface circuit 122 within the memory module 120, and during a period that the driver 200 shown in FIG. 2 does not send data to the other device, the driver 200 may be configured to serve as an on-die termination, and the memory module 120 may re-apply a ZQ calibration In one embodiment, the memory interface circuit 112/122 may further comprise a programmable delay circuit to adjust the delay amount of the data signal in response to the changing of the supply voltage VDD. Please refer to FIG. 6, which is a diagram illustrating a programmable delay circuit 610 according to one embodiment of the present invention. As shown in FIG. 6, the programmable delay circuit 610 is arranged to delay the data signal DQ to generate a delayed data signal to the pre-driver 410 shown in FIG. 4, where the delay amount of the programmable delay circuit 610 is determined based on a delay control signal D[P:1] generated in response to the supply voltage VDD.

Figure 7:
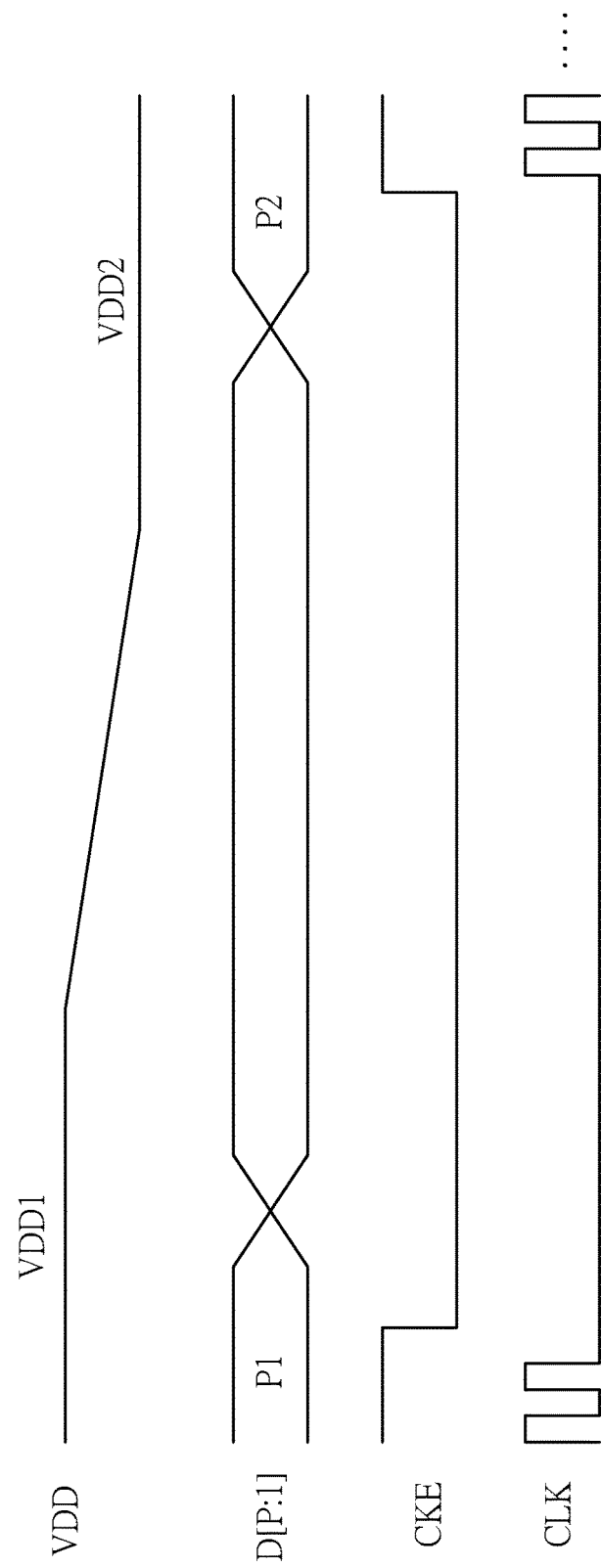
FIG. 7 is a diagram illustrating a timing diagram of the delay control signal and the related signals when the supply voltage changes according to one embodiment of the present invention.

Please refer to FIG. 7, which is a diagram illustrating a timing diagram of the related signals when the supply voltage VDD changes according to one embodiment of the present invention. As shown in FIG. 7, originally, the supply voltage VDD has the first value VDD1, the delay control signal D[P:1] has a setting [P1:1] to determine a first delay amount of the programmable delay circuit 610, the clock enable signal CKE is at a high level, the clock signal CLK is outputted to the memory module 120, and the memory controller 110 functions well to access the memory module 120. Then, when the PMIC wants to change the supply voltage VDD of the memory controller 110 and the memory module 120 to save power, the memory controller 110 will disable the clock enable signal CKE (i.e. at a low level) and stop outputting the clock signal CLK to the memory module 120, then the PMIC changes the supply voltage VDD to have the second value VDD2 . After the supply voltage VDD changes, the memory controller 110 may send the delay control signal D[P:1] having another setting [P2:1] to determine a second delay amount of the programmable delay circuit 610. Finally, the memory controller 110 enables the clock enable signal CKE and outputs the clock signal CLK to access the memory module 120.

In one embodiment, when the supply voltage VDD decrease, the driving ability of the driver may be lowered, therefore, the delay control signal D[P:1] may control the programmable delay circuit 610 to have smaller delay amount.

Figure 8:
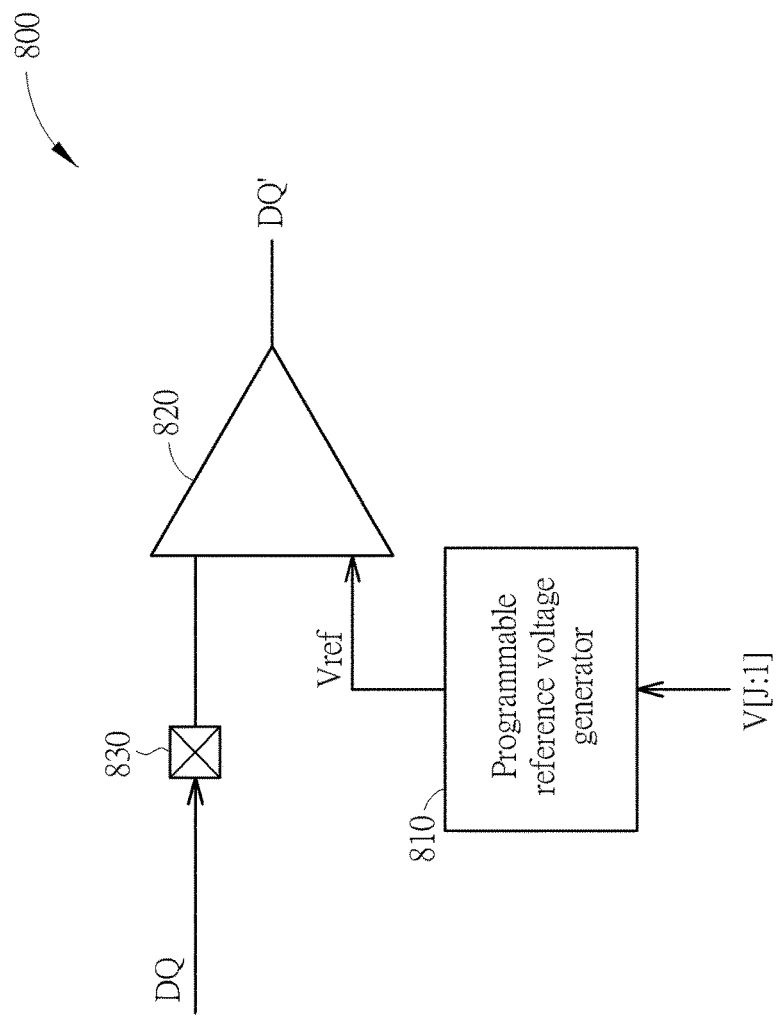
FIG. 8 is a diagram illustrating a receiver within the memory interface circuit according to one embodiment of the present invention.

Please refer to FIG. 8, which is a diagram illustrating a receiver 800 within the memory interface circuit 112/122 according to one embodiment of the present invention. As shown in FIG. 8, the receiver 800 comprises a programmable reference voltage generator 810 and a comparator 820, where the programmable reference voltage generator 810 is arranged to generate a reference voltage Vref based on a control signal V [J:1] generated in response to the supply voltage VDD, and the comparator 820 is arranged to compare the data signal DQ received from the pad 830 to re-generate the data signal DQ'.

In this embodiment, the receiver 800 is positioned in the memory interface circuit 112/122 to receive the data signal DQ to the memory module 120, but it's not a limitation of the present invention. In other embodiments, the receiver 800 may be applied to any receiver within the memory interface circuit 112 to receive the signal from the memory module 120, or the receiver 800 may be applied to any receiver within the memory interface circuit 122 to receive the signal from the memory controller 110. For example, the memory interface circuit 112 may comprise a plurality of receivers 800 to receive the data signal DQ and the data strobe signal DQS from the memory module 120 ; and the memory interface circuit 122 may comprise a plurality of receivers 800 to receive the data signal DQ, the data strobe signal DQS, the command signals CMDs, the clock signal CLK and the clock enable signal CKE from the memory controller 110

Figure 9:
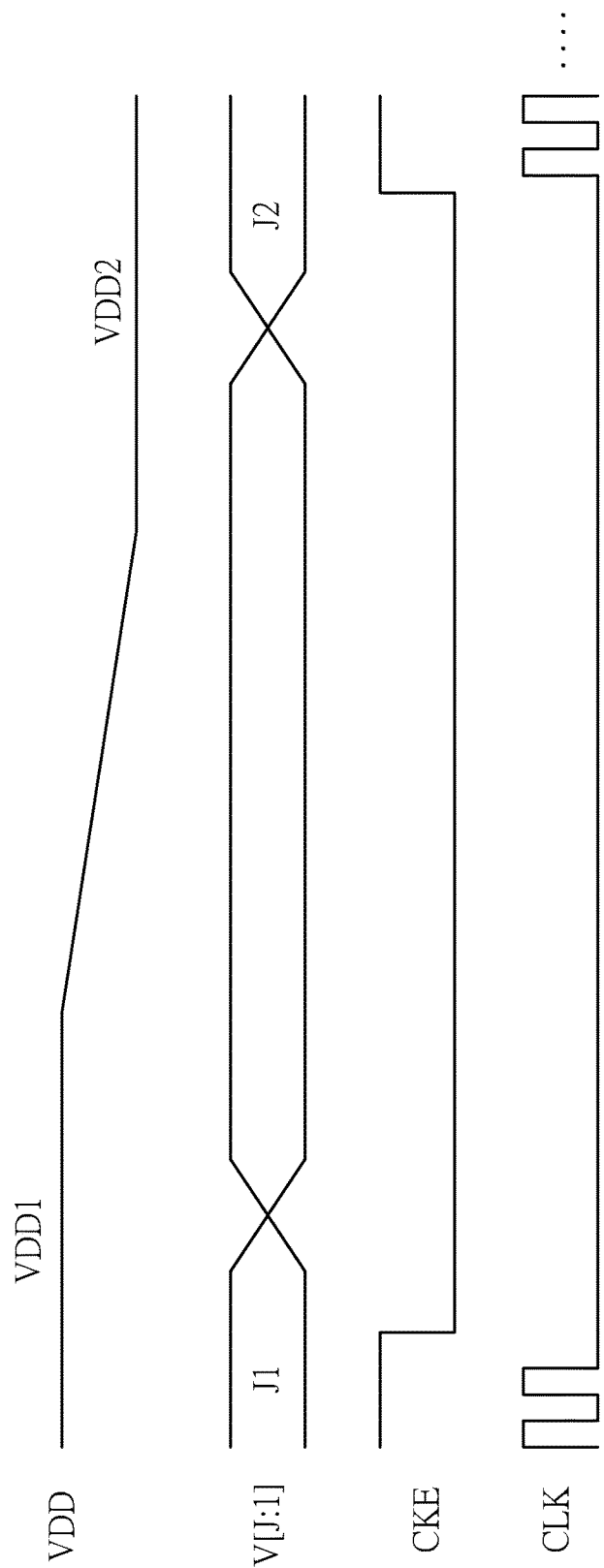
FIG. 9 is a diagram illustrating a timing diagram of the control signal and related signals when the supply voltage changes according to one embodiment of the present invention.

Please refer to FIG. 9, which is a diagram illustrating a timing diagram of the related signals when the supply voltage VDD changes according to one embodiment of the present invention. As shown in FIG. 9, originally, the supply voltage VDD has the first value VDD1, the control signal V [J:1] has a setting [J1:1] to make the programmable reference voltage generator 810 output a first reference voltage, the clock enable signal CKE is at a high level, the clock signal CLK is outputted to the memory module 120, and the memory controller 110 functions well to access the memory module 120. Then, when the PMIC wants to change the supply voltage VDD of the memory controller 110 and the memory module 120 to save power, the memory controller 110 will disable the clock enable signal CKE (i.e. at a low level) and stop outputting the clock signal CLK to the memory module 120, then the PMIC changes the supply voltage VDD to have the second value VDD2 . After the supply voltage VDD changes, the memory controller 110 may send the delay control signal V[J:1] having another setting [J2:1] to make the programmable reference voltage generator 810 output a first reference voltage. Finally, the memory controller 110 enables the clock enable signal CKE and outputs the clock signal CLK to access the memory module 120.

In one embodiment, when the supply voltage VDD decreases, the reference voltage Vref is decreased to make the comparator 820 to accurately re-generate the data signal DQ'.

Briefly summarized, in the embodiments of the present invention, when the supply voltage VDD changes, the settings of the driver, programmable delay circuit and/or the programmable reference voltage generator are adjusted in response to the changing of the supply voltage VDD. Therefore, the driving ability may not be worsened, and the access quality will be more stable.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory interface circuit, comprising:
   a first variable impedance circuit, coupled between a first supply voltage and a pad; and
   a second variable impedance circuit, coupled between a second supply voltage and the pad;
   wherein the memory interface circuit is applied to a dynamic random access memory (DRAM) controller or a DRAM module, and when the first supply voltage changes, at least one of the first variable impedance circuit and the second variable impedance circuit is controlled by a digital control signal generated by the DRAM controller to have different setting in response to the changing of the first supply voltage.

2. The memory interface circuit of claim 1, wherein the first variable impedance circuit comprises a plurality of first transistors connected in parallel, and an impedance of the first variable impedance circuit is controlled by determining a quantity of turned-on first transistors.

3. The memory interface circuit of claim 2, wherein the second variable impedance circuit comprises a plurality of second transistors connected in parallel, and an impedance of the second variable impedance circuit is controlled by determining a quantity of turned-on second transistors.

4. The memory interface circuit of claim 2, wherein when the first supply voltage decreases, the quantity of turned-on first transistors is increased.

5. The memory interface circuit of claim 2, further comprising:
   a pre-driver, coupled to the first variable impedance circuit, wherein the pre-driver receives a data signal, and selectively outputs the data signal to gate electrodes of the first transistors according to at least a driving control signal, respectively, wherein the driving control signal indicates a number of the first transistors receiving the data signal.

6. The memory interface circuit of claim 5, further comprising:
   a programmable delay circuit, for delaying an original data signal to generate the data signal to the pre-driver;
   wherein when the first supply voltage changes, a delay amount of the programmable delay circuit changes in response to the changing of the first supply voltage.

7. The memory interface circuit of claim 1, wherein the first variable impedance circuit or the second variable impedance circuit changes its impedance in response to the changing of the first supply voltage when a clock enable (CKE) signal is at a low voltage level.

8. The memory interface circuit of claim 1, wherein the first variable impedance circuit or the second variable impedance circuit changes its impedance in response to the changing of the first supply voltage when no clock signal is transmitted via the memory interface circuit.

9. The memory interface circuit of claim 1, wherein the memory interface circuit is applied in the DRAM module, and when the first supply voltage changes, at least one of the first variable impedance circuit and the second variable impedance circuit receives the digital control signal from the DRAM controller to change its impedance in response to the changing of the first supply voltage.

10. The memory interface circuit of claim 1, wherein the memory interface circuit is applied in the DRAM module, and when the first supply voltage changes, the first variable impedance circuit and the second variable impedance circuit serve as an on-die termination, and the DRAM module re-applies a ZQ calibration.

11. The memory interface circuit of claim 1, further comprising:
    a programmable reference voltage generator, for generating a reference voltage according to a control signal generated in response to the changing of the first supply voltage; and
    a comparator, for comparing a received signal from the pad with the reference voltage to re-generate the received signal.

12. The memory interface circuit of claim 11, wherein when the first supply voltage decreases, the reference voltage is decreased.

13. A memory interface circuit, comprising:
    a programmable reference voltage generator, for generating a reference voltage according to a control signal generated according to a level of a supply voltage of the memory interface circuit; and
    a comparator, for comparing a received signal from a pad with the reference voltage to re-generate the received signal;
    wherein the memory interface circuit is applied in a DRAM module, and when the supply voltage changes, the programmable reference voltage generator receives another control signal from a DRAM controller to change a level of the reference voltage.

14. The memory interface circuit of claim 13, wherein when the first supply voltage decreases, the reference voltage is decreased.

15. A control method of a memory interface circuit within a DRAM controller or a DRAM module, wherein the memory interface comprises a first variable impedance circuit coupled between a first supply voltage and a pad, and a second variable impedance circuit coupled between a second supply voltage and the pad, and the control method comprises:
    when the first supply voltage changes, receiving a digital control signal generated by the DRAM controller to apply different setting to at least one of the first variable impedance circuit and the second variable impedance circuit of the memory interface circuit within the DRAM controller or the DRAM module in response to the changing of the first supply voltage.

16. The control method of claim 15, wherein the first variable impedance circuit comprises a plurality of first transistors connected in parallel, and the second variable impedance circuit comprises a plurality of second transistors connected in parallel, and the step of applying the different setting to at least one of the first variable impedance circuit and the second variable impedance circuit comprises:
    controlling a quantity of turned-on first transistors to determine an impedance of the first variable impedance circuit; or controlling a quantity of turned-on second transistors to determine an impedance of the second variable impedance circuit.

17. The control method of claim 16, wherein the step of controlling the quantity of turned-on first transistors to determine the impedance of the first variable impedance circuit comprises:
when the first supply voltage decreases, increasing the quantity of turned-on first transistor.

18. The control method of claim 15, wherein the step of applying the different setting to at least one of the first variable impedance circuit and the second variable impedance circuit comprises:
applying the different setting to at least one of the first variable impedance circuit and the second variable impedance circuit in response to the changing of the first supply voltage when a clock enable (CKE) signal is at a low voltage level.

19. The control method of claim 15, wherein the step of applying the different setting to at least one of the first variable impedance circuit and the second variable impedance circuit comprises:
applying the different setting to at least one of the first variable impedance circuit and the second variable impedance circuit in response to the changing of the first supply voltage when no clock signal is transmitted via the memory interface circuit.

20. A memory interface circuit within a dynamic random access memory (DRAM) controller or a DRAM module, comprising:
a first variable impedance circuit, coupled between a first supply voltage and a pad; and
a second variable impedance circuit, coupled between a second supply voltage and the pad;
wherein when the first supply voltage changes, at least one of the first variable impedance circuit and the second variable impedance circuit is controlled to have different setting in response to the changing of the first supply voltage; and the first variable impedance circuit or the second variable impedance circuit changes its impedance in response to the changing of the first supply voltage when a clock enable (CKE) signal is at a low voltage level.

21. The memory interface circuit of claim 20, wherein the first variable impedance circuit comprises a plurality of first transistors connected in parallel, and an impedance of the first variable impedance circuit is controlled by determining a quantity of turned-on first transistors.

22. The memory interface circuit of claim 21, wherein the second variable impedance circuit comprises a plurality of second transistors connected in parallel, and an impedance of the second variable impedance circuit is controlled by determining a quantity of turned-on second transistors.

23. The memory interface circuit of claim 21, wherein when the first supply voltage decreases, the quantity of turned-on first transistors is increased.

24. A memory interface circuit within a dynamic random access memory (DRAM) controller or a DRAM module, comprising:
a first variable impedance circuit, coupled between a first supply voltage and a pad; and
a second variable impedance circuit, coupled between a second supply voltage and the pad;
wherein when the first supply voltage changes, at least one of the first variable impedance circuit and the second variable impedance circuit is controlled to have different setting in response to the changing of the first supply voltage; and the first variable impedance circuit or the second variable impedance circuit changes its impedance in response to the changing of the first supply voltage when no clock signal is transmitted via the memory interface circuit.

25. The memory interface circuit of claim 24, wherein the first variable impedance circuit comprises a plurality of first transistors connected in parallel, and an impedance of the first variable impedance circuit is controlled by determining a quantity of turned-on first transistors.

26. The memory interface circuit of claim 25, wherein the second variable impedance circuit comprises a plurality of second transistors connected in parallel, and an impedance of the second variable impedance circuit is controlled by determining a quantity of turned-on second transistors.

27. The memory interface circuit of claim 25, wherein when the first supply voltage decreases, the quantity of turned-on first transistors is increased.

28. A memory interface circuit, comprising:
a first variable impedance circuit, coupled between a first supply voltage and a pad; and
a second variable impedance circuit, coupled between a second supply voltage and the pad;
wherein when the first supply voltage changes, at least one of the first variable impedance circuit and the second variable impedance circuit is controlled to have different setting in response to the changing of the first supply voltage; and the first variable impedance circuit or the second variable impedance circuit changes its impedance in response to the changing of the first supply voltage when no clock signal is transmitted via the memory interface circuit;
wherein the memory interface circuit is applied in the DRAM module, and when the first supply voltage changes, the first variable impedance circuit and the second variable impedance circuit serve as an on-die termination, and the DRAM module re-applies a ZQ calibration.

29. The memory interface circuit of claim 28, wherein the first variable impedance circuit comprises a plurality of first transistors connected in parallel, and an impedance of the first variable impedance circuit is controlled by determining a quantity of turned-on first transistors.

30. The memory interface circuit of claim 29, wherein the second variable impedance circuit comprises a plurality of second transistors connected in parallel, and an impedance of the second variable impedance circuit is controlled by determining a quantity of turned-on second transistors.

31. The memory interface circuit of claim 29, wherein when the first supply voltage decreases, the quantity of turned-on first transistors is increased.

* * * * *